United States Patent
Stelzl et al.

(10) Patent No.: US 7,552,532 B2
(45) Date of Patent: Jun. 30, 2009

(54) METHOD FOR HERMETICALLY ENCAPSULATING A COMPONENT

(75) Inventors: Alois Stelzl, Munich (DE); Hans Krueger, Munich (DE); Gregor Feiertag, Munich (DE); Ernst Christl, Vilsbiburg (DE)

(73) Assignee: EPCOS AG, Munich (DE)

( * ) Notice: Subject to any disclaimer, the term of this patent is extended or adjusted under 35 U.S.C. 154(b) by 579 days.

(21) Appl. No.: 10/484,942

(22) PCT Filed: Jun. 14, 2002

(86) PCT No.: PCT/DE02/02188
§ 371 (c)(1),
(2), (4) Date: Jul. 22, 2004

(87) PCT Pub. No.: WO03/012856
PCT Pub. Date: Feb. 13, 2003

(65) Prior Publication Data
US 2004/0237299 A1  Dec. 2, 2004

(30) Foreign Application Priority Data
Jul. 27, 2001 (DE) ................. 101 36 743

(51) Int. Cl.
*H05K 13/00* (2006.01)
(52) U.S. Cl. ............... 29/855; 29/412; 29/842; 29/832; 29/841; 264/157; 264/272.17; 264/272.11; 264/236; 174/521; 174/524; 257/787; 257/790; 438/106; 438/108; 438/110; 438/112

(58) Field of Classification Search ........... 29/412–415, 29/837–839, 842, 832, 835, 841, 855; 264/157, 264/272.17, 272.11, 236, 347; 174/52.2, 174/52.3, 52.4; 257/666, 616, 787, 790; 361/795; 438/106, 108, 110, 112
See application file for complete search history.

(56) References Cited

U.S. PATENT DOCUMENTS 4,323,593 A * 4/1982 Tsunashima ............. 427/98.3
5,081,563 A * 1/1992 Feng et al. ............... 361/795

(Continued)

FOREIGN PATENT DOCUMENTS

DE  3 138 743 A1  4/1983

(Continued)

*Primary Examiner*—Rick K Chang
(74) *Attorney, Agent, or Firm*—Schiff Hardin LLP

(57) ABSTRACT

A method is provided to produce a hermetic encapsulation for an electronic component, which may be an optical and at least partially light-permeable component or a surface wave component, comprises attaching and electrically contacting a component based on a chip to a carrier comprising electrical connection surfaces, such that a front of the chip bearing component structures facing the carrier is arranged to clear it, covering a back of the chip with a film made of synthetic material, such that edges of the film overlap the chip; tightly bonding the film and carrier in an entire edge region around the chip; structuring the film such that the film is removed around the edge region in a continuous strip parallel to the edge region; and applying a hermetically sealing layer over the film, such that this layer hermetically terminates with the carrier in a contact region outside of the edge region.

14 Claims, 4 Drawing Sheets

U.S. PATENT DOCUMENTS

| | | | |
|---|---|---|---|
| 5,439,849 A | 8/1995 | McBride et al. | |
| 5,455,459 A * | 10/1995 | Fillion et al. | 257/760 |
| 5,776,657 A * | 7/1998 | Schaedeli et al. | 430/281.1 |
| 6,247,229 B1 * | 6/2001 | Glenn | 29/841 |
| 6,329,739 B1 | 12/2001 | Sawano | |
| 6,492,194 B1 * | 12/2002 | Bureau et al. | 438/106 |
| 6,722,030 B1 * | 4/2004 | Stelzl et al. | 29/841 |
| 2001/0009277 A1 | 7/2001 | Gaynes et al. | |

FOREIGN PATENT DOCUMENTS

| | | |
|---|---|---|
| DE | 198 16 309 A1 | 12/1998 |
| EP | 0 967 647 A2 | 12/1999 |
| EP | 1 091 406 A2 | 4/2001 |
| EP | 1 093 159 A1 | 4/2001 |
| JP | 11027088 | 1/1999 |
| JP | 2000004139 | 1/2000 |
| JP | 2001176995 | 6/2001 |
| WO | 99/43084 | 8/1999 |

\* cited by examiner

METHOD FOR HERMETICALLY ENCAPSULATING A COMPONENT

BACKGROUND OF THE INVENTION

The invention relates to a method produce a hermetic encapsulation for an electronic component.

A method to hermetically encapsulate a component is, for example, known from International Patent Publication WO 99/43084 that discloses components, in particular surface wave components, are applied via flip-chip technology to a carrier provided with solderable connection surfaces. The component is soldered to it via bumps. (solder balls) in clearance of the carrier, such that the surface with the component structures faces the carrier.

To hermetically encapsulate the components located on the carrier, these are ultimately covered with a metal film or a metal-coated synthetic film on the carrier from the back and glued or laminated. The film terminates in a sealed manner with the carrier between the components mounted on the carrier, such that a hermetic encapsulation ensues for the component structures. It is also proposed to further stabilize and to further hermetically seal the encapsulation via coating or sealing, for example with epoxy resin. The components can subsequently be individualized via division of the carrier plate.

It has emerged that the use of a metal film as well as the use of a metal-coated synthetic film for direct application to the back of the component is problematic, and can lead to components whose hermetic seal is unsatisfactory.

SUMMARY OF THE INVENTION

It is therefore the object of the present invention to provide a method to produce a hermetic encapsulation which is simple to implement and leads in a secure manner to a hermetically encapsulated component.

This object is inventively achieved via a method to produce a hermetic encapsulation for an electronic component, comprising:

a) attaching and electrically contacting a component based on a chip to a carrier comprising electrical connection surfaces, such that a front of the chip bearing component structures facing the carrier is arranged to clear it;

b) covering of a back of the chip with a film made of synthetic material, such that edges of the film overlap the chip;

c) tightly bonding the film with the carrier in an entire edge region around the chip;

d) structuring the film such that the film is removed around the edge region in a continuous strip parallel to the edge region; and e) applying a hermetically sealing layer over the film, such that the sealing layer hermetically terminates with the carrier in a contact region outside of the edge region.

The an embodiment of the inventive method initially coats a component applied to a carrier in a flip-chip manner with a first film, to bond this with the surface of the carrier in the edge region around the component, to subsequently structure the film, and as a last step to apply a hermetically sealing layer over the film such that it hermetically terminates in a sealed manner with the carrier outside of the edge region.

It is possible, via the division of the encapsulation into two layers to be applied independent of one another, to optimize both steps independent of one another. The first step can be adapted such that the film, in cooperation with the application conditions, is applied sealed to the back of the component, and is applied sealed to the carrier around the edge region.

The structuring of the film ensues in an intermediate step in which a dimensioning of the covering film ensues that determines the size of the encapsulated component. Furthermore, in the structuring outside of the edge region, this comprises the uncovering of the surface of the carrier so that the hermetically sealing layer can there come in contact with the carrier in order to ensure a sealed termination with the carrier.

The film already tightly enclosing the component and applied to the carrier enables the hermetic layer to be applied in a plurality of different methods. Since the component is covered under the film, isotropic layer generation methods, wet-chemical methods, gas or vapor methods, as well as plasma methods can all be used. Given suitably selected film, the hermitically sealing layer can also be applied as molten mass. In comparison to the known methods in which, for example, a metal-coated synthetic film is used as a sole coating, in the inventive methods, the impermeability via the two layers or, respectively, films applied independent of one another, is significantly improved. While the application of the film can be optimized for positive fit, the second layer can be optimized for impermeability.

A positive-fit application of the film on the back of the chip and the carrier may be, in particular, inventively achieved with a thermoplastic film. This can be softened given application under increased temperature and laminated on the back of the chip and surface of the carrier under pressure. The positive-fit application can be aided via application of a negative pressure between film and carrier.

Materials that are suited for the thermoplastic material for the film are those that are resistant against contact with current-bearing metal surfaces, that are corrosion-stable and deterioration-stable, show no gas emission, exhibit a high temperature resistance, and/or possess a sufficient bonding to the carrier material. A further criteria is the laminability of the corresponding film, which, upon softening and lamination during the application to the chip and the carrier, may acquire no damage, and in particular no tears or holes. Films made from polamide and polyimide, which exhibit a high thermal stability, are particularly suitable.

Further suitable materials for the film are duroplasts and reaction resins, for example, epoxy resins. Due to the limited lamination properties of hardened duroplasts and reaction resins, films made from such materials are preferably used in an unhardened or at least not completely hardened state. For reaction resins, for example, the technique of curtain casting is suitable, in which a thin film made from a liquid polymer (for example, a reaction resin) is produced on a substrate via casting, and is subsequently hardened on the substrate. Given suitably adjusted consistency of the reaction resin, such a layer can be manipulated like a film.

Since the application with mechanical pressure of the film on the chip can lead to a deformation of the flip-chip bond, a material of high stability that shows no mechanical deformation upon the application of the films is advantageously selected for the bumps. Particularly suitable materials include SnAg, SnAgCu, SnCu, Au or conductive paste. With these, unwanted and uncontrollable geometry changes of the component during the method are prevented.

Various technologies are suited for structuring the applied film. With the aid of a photolithography, for example, it is possible to define and to protect the regions of the film that should remain on the carrier or, respectively, the component. A wet-chemical or a plasma etching method can then be used for structuring. However, it is also possible to directly effect the structuring of the film, for example, via mechanical layer denudation methods or by way of a laser. This structuring ensues such that the film in the width defined by the edge region around the chip remains, in that it is also firmly applied to the carrier. The function of the film as a seal of the component thus remains or, respectively, is assured with regard to the application method of the hermetically sealing layer or as a component of the entire encapsulation. The film is then removed outside of the edge region, at least insofar as that, continuously around the edge region, a sufficiently wide surface area of the carrier is uncovered in order to ensure a tight sealing of the hermetically sealed layer to be applied with the carrier.

In a further embodiment of the invention, it is possible to remove the film not in a sufficiently wide strip, but rather in the region of at least two substantially narrower strips that comprise the edge region in less separation parallel to the edge region. In this manner, a hermetic seal of the hermetically sealed layer to the carrier is enabled in the contact region on a substantially smaller area than given the use of only one strip. The surface on the carrier required for hermetic encapsulation of the component, and therewith also the size of the entire component, is thereby reduced.

It is, for example, sufficient to fashion the strips with a width and at a distance from one another that, respectively, approximately corresponds to the thickness of the film. While, given a single contact strip for the hermetic layer to the carrier, a relatively large strip width is provided, for the (for example) two strip-shaped contact regions widths of only, for example, respectively approximately 35 μm are necessary, which necessitates a lesser areal requirement.

If required, it is possible to remove the film in the region of more than two parallel strips in order to further increase the impermeability of the hermetic layer or, respectively, the tight termination of the hermetic layer relative to the carrier. A further improved impermeability of the entire encapsulation is therewith also achieved.

In a further embodiment of the invention, it is proposed, in addition to increasing the impermeability of the encapsulation near the surface of the carrier, to also uncover a region of the chip surface, in particular on the back or circumferential to the side surfaces, in order to enable at this point a tight contact of the hermetically sealing layer directly with the chip. For this, the partial removal of the film in a strip-shaped region can also ensue with the aid of a laser technique, whereby the strip either runs on the lateral outer surfaces of the chip and is circumferentially sealed, or is arranged on the back of the chip and runs in the area of the outer edges of the chip. However, it is also possible to uncover a part of the back or the entire back of the chip with the used structuring method, for example with a photolithography technique.

In a further embodiment of the invention, the chip can be provided on the back with at least one partial metallization; preferably, however, it is metallized over the entire surface. In this manner, a good heat-conductive bond between the chip and the hermetically sealing layer can be produced, which is not necessarily assured by the used film alone. The back-metallization can moreover be connected with the component structures on the front side of the chip facing the surface of the carrier. In this manner, an additional connection possibility for the component structures is achieved on the back of the chip.

A metal layer is preferably applied as a hermetically sealing layer. This can in particular be generated in a multi-stage method, whereby first a base metallization is applied over the entire surface of the film and in the contact region-uncovered surface of the carrier, which is strengthened in a subsequently step. A sputter method or a current-less metal precipitation method or a combination of both methods is preferably used to generate a base metallization.

For example, a base metallization can advantageously be generated via sputtering of copper and/or nickel. For current-less precipitation on non-conducting surfaces such as the film, in particular, copper precipitation baths are known. The current-less precipitation method additionally has the advantage that it also ensures a metal precipitation at such locations of the component that are not accessible for the sputtering.

With other methods, at such locations electrically non-conductive regions could be created that then could no longer be strengthened. These locations would then be potential leakage places for the component, and are prevented via the use of the current-less metal precipitation. The current-less metal precipitation is preferably implemented after the sputtering of a base metallization, since in particular a sputtered titanium/copper layer exhibits advantages with regard to a good adhesion to the film, and largely prevents a diffusion of dampness inside the component during the subsequent wet-chemical or, respectively, electrochemical process.

Galvanic methods are in particular suited to strengthen the base metallization, particularly when a continuous and tight metallization already exists. Particularly suitable for galvanic strengthening is the deposition of copper that is subsequently covered with a thinner layer of a corrosion-inhibiting metal, for example with nickel or a precious metal. However, it is also possible to generate the metal layer up to the desired thickness via current-less deposition either directly on the component or on the base metallization. It is also possible to generate the metal layer with or without base metallization via vapor deposition of a metal or via bringing the component in contact with a molten metal. Combinations of the specified methods are also suitable.

The thickness of the metal layer that is used as a hermetically sealing layer is selected dependent on the desired properties. A sufficient impermeability is already achieved with a few μm. If the hermetically sealing layer or, respectively, the metal layer is used for HF shielding of electrical components, in particular to shield components working with HF frequencies, a greater thickness can be required to achieve the desired HF shielding from outside influences or for shielding with regard to radiation from the component. In general, metal layers at a thickness of approximately 3 to 14 μm are suitable.

If the metal layer is used for HF shielding, it is preferably connected to ground. This can ensue in such a way that, on the carrier in the contact region that is directly in contact with the metal layer, a metallization is provided that is connected to the ground connection of the component. For example, this metallization can be contacted with a feedthrough through the carrier that is in turn electrically conductively connected with ground connections on the bottom of the carrier.

In a further embodiment of the invention, the metal layer is connected both with an electrical connection on the carrier and with the back of the chip. For this, it is necessary in the structuring (or in a separate step) to release the back of the chip from the film, at least in the region of this contact, or to uncover the hermetically sealing layer there before the application.

For this, a chip is used that comprises a metallization on the back of the chip. The electrical connection of this metallization (via the metal layer of the hermetically sealing layer) with an electrical component connection (for example, on the bottom of the carrier) can then serve to electrically modulate the component, in particular to electrically modulate a component operating with acoustic waves, in particular a filter.

In a further embodiment of the invention, a layer that is suitable for the dampening of bulk waves is applied directly to the back of the chip before or after the application of the film, when, in the latter case in the structuring, the back of the chip is uncovered, whereby the component in this case is a component operating with acoustic surface waves. Such a bulk wave-dampening layer is acoustically adapted to the material of the chip and comprises an E-module suitable for dampening. Such materials are known in the art.

Furthermore, the application of inorganic and ceramic materials (for example, silicon dioxide, glass, or silicon carbide) is also suitable for generation of a hermetically sealing layer. In particular, materials based on silicon dioxide, particularly glasses, can be generated or applied to any surfaces in a series of thin-layer methods. Glasses have the advantage that they can be softened and compressed via a temperature step due to their low melting point. A passage is thereby also achieved via the softening, and therewith a good areal covering conforming to the surface.

For a further embodiment of the inventive encapsulation, it is proposed to apply on the carrier another synthetic covering, what is known as a "glob top", over the hermetically sealing layer. This is applied to the carrier over the entire surface over the hermetically sealing layer in an initially fluid but mostly viscous form, preferably up to such a height that a uniform layer thickness is achieved over the carrier, or, respectively, an even surface of the entire component is achieved. Reaction resins are particularly suitable as glob top covering materials. However, it is also possible to use thermoplastic molding material for this. While the reaction resin can also be dripped or poured, a corresponding injection mold is necessary to apply molding material.

A mechanically and electrically adapted material, or a combination of such materials, is suitable for the inventively used carrier. The carrier material preferably exhibits sufficient mechanical resilience and is moreover hermetically sealed against gases and humidity. A carrier with a multi-layer assembly is preferably used which comprises on the surface metallizations for contacting the component via bumps, and that on the back possesses connection metallizations to connect with a circuit board, in particular in an SMD technique. Wiring levels can be provided between two layers, whereby the connection between the different levels or, respectively, the intermediate levels and the top and bottom of the carrier ensues via feedthroughs. To increase the impermeability, all feedthroughs are not continuous from the top to the bottom of the carrier, and are at least laterally displaced against one another. A plurality of materials are suitable for the carrier, for example, aluminum oxide, glass, HTCC, LTCC or organic carriers such as PCB or film materials such as Kapton® or Mylar®.

In order to further achieve a reliable contacting given additional miniaturization of the components, particularly given the flip-chip bonds of the component to the carrier, an LTCC ceramic is advantageous in that it exhibits an exact predetermined geometry of the metallization due to its slight shrinkage upon firing. Carriers made of organic materials can in turn namely be produced with exact geometry; however, they therefore exhibit a lesser impermeability with regard to environmental influences.

A carrier can be used for connection with precisely one chip, and is then preferably correspondingly dimensioned to the chip measurements. However, it is also possible to provide a carrier to accept a plurality of chips which then comprises correspondingly separated or separable metallizations to contact the individual chips. After the application of the chips on the carrier by way of flip-chip technology, the inventive method for encapsulation for all components or, respectively, for the entire carrier, can be implemented all at once. The carrier can in conclusion be isolated into the individual chips, in that the carrier is divided between the chips. This can, for example, ensue via sawing, breaking or other division methods.

A further embodiment of the invention may be used to encapsulate a module. In this case, the carrier represents the module substrate on which the cited component is applied together with further similar or different components. The further components can thereby be applied to the module both via flip-chip technology and via SMD technology. However, it is important that the entire module can be encapsulated via covering film, structuring of the film, and application of a hermetically sealing layer. LTCC ceramics are particularly suitable to produce such modules.

An advantageous application may utilize the inventive method to encapsulate surface wave components whose component structures can, on the one hand, not be covered with additional layers, but that, on the other hand, are particularly sensitive to corrosion and other external influences and therefore require a hermetic encapsulation. Moreover, in surface wave components, the requirement for further miniaturization is particularly pronounced in order to achieve an additional volume and weight savings in the preferred application in mobile telecommunication devices. A particularly small and light packaging or encapsulation of the components (here the surface wave components) is achieved with the inventive encapsulation.

A further group of sensitive components that can be reliably and tightly encapsulated with the inventive encapsulation are sensors. It is therefore also possible to inventively encapsulate optical and in particular opto-electronic components. In this case, in particular light-permeable materials, and in particular a light-permeable carrier are used. It is also possible for encapsulation of optical components to keep the back of the component at least partially free of individual or all of the layers of the encapsulation.

DESCRIPTION OF THE DRAWINGS

In the following, embodiments of the invention are specified in detail using exemplary embodiments and figures appertaining thereto.

DETAILED DESCRIPTION OF THE PREFERRED EMBODIMENTS

Figure 1:
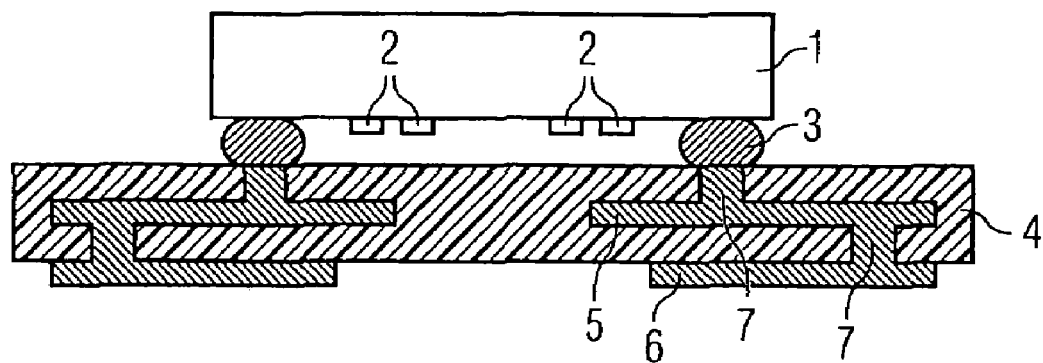
FIG. 1 is a schematic cross-section of a component flip-chip bonded to the carrier.

FIG. 1 shows in schematic cross-section a chip 1 that bears on its underside component structures 2 and is fashioned, for example, as a surface wave component. The chip 1 is connected via bump solder connections 3 with metallic connection surfaces on a carrier 4. The carrier 4 is here fashioned two-sided, and comprises a multi-layer wiring. The middle metallization levels 5 serve for circuitry, and if necessary to seal the feedthroughs 7. The component structures 2 are connected with the connection metallizations 6 on the bottom of the carrier via the feedthroughs 7. The feedthroughs 7 through separate layers of the carrier are always laterally displaced against one another, such that continuous bores through the entire carrier 4 (that potentially represent leakages for the hermetic encapsulation of the component) are prevented.

Figure 2:
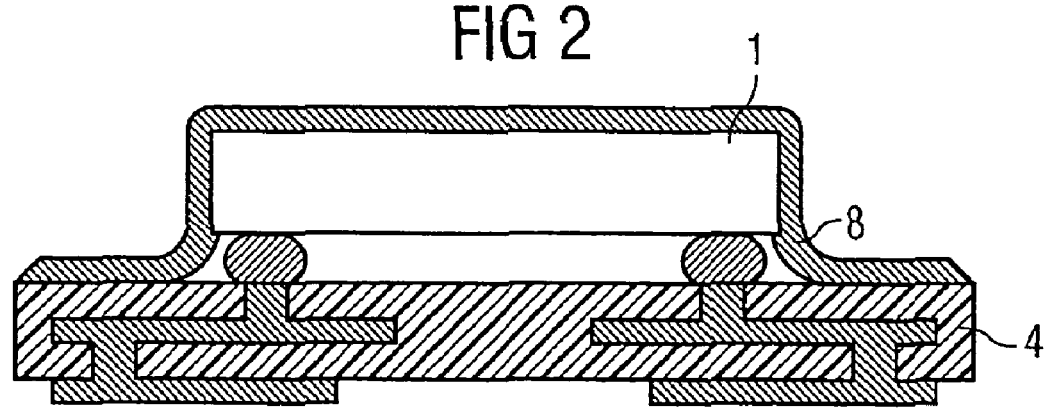
FIG. 2 is a schematic cross-section of the component with the film applied over it.

FIG. 2 illustrates a film 8 comprised of a synthetic material that is applied over the back of the component 1 and the entire carrier 4 and laminated to the back of the chip 1 and the surface of the carrier 4 surrounding it via temperature increase and under pressure. A tight bond of the film 8 with the surface of the carrier 4 is thereby created in an edge region 13 surrounding the chip 1.

Figure 3:
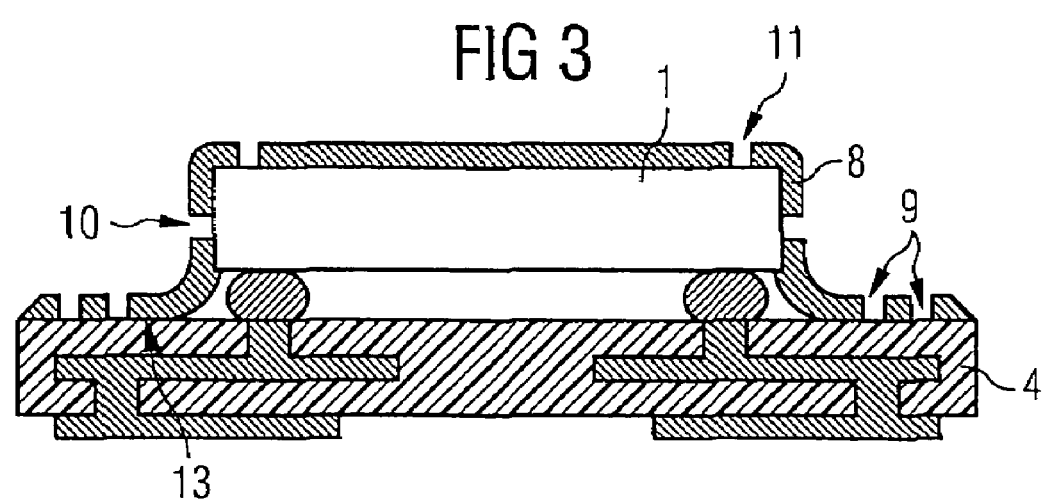
FIG. 3 is a schematic cross-section of the component with different strip-shaped structuring possibilities.

FIG. 3 shows in schematic cross-section how, with the aid of strip-shaped structurings 9 of the synthetic film 8, strip-shaped regions of the carrier surface are likewise uncovered.

Figure 4:
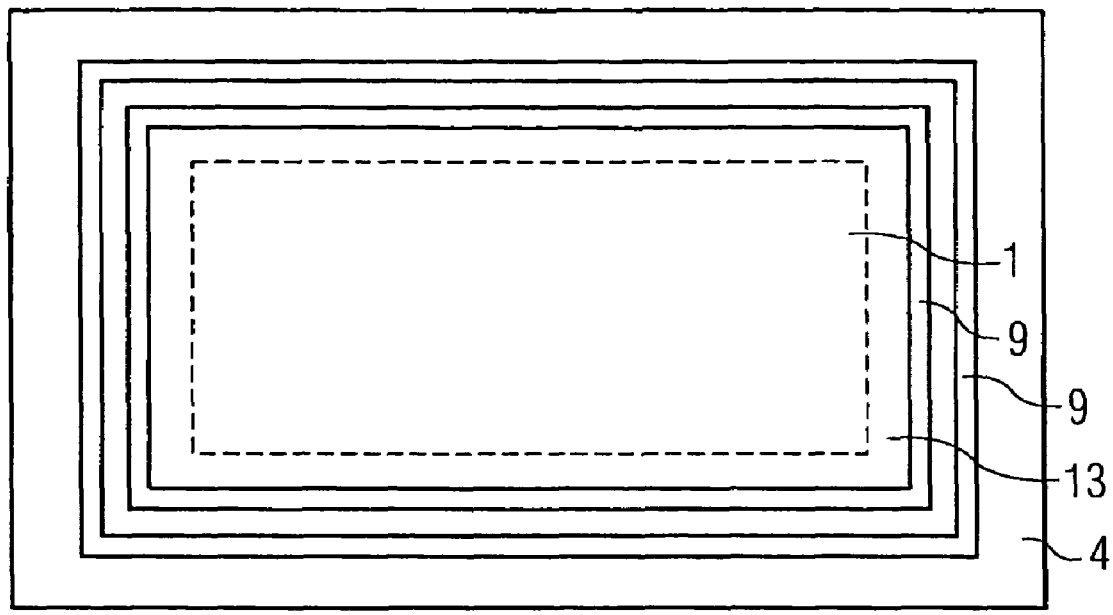
FIG. 4 is a top view of the component after a strip-shaped structuring.

FIG. 4 shows, in schematic plan view, the carrier 4 the chip 1 bonded thereto, and an exemplary arrangement of these strip-shaped structurings 9. By leaving an edge region 13 around the chip 1, the strip-shaped structurings 9 run parallel to the outer edge of the chip or, respectively, parallel to the edge region. The hermetically sealing layer applied in a later step can hermetically terminate with the surface of the carrier 4 in the strip-shaped structurings.

FIG. 3 shows further possibilities for strip-shaped structurings 10 along the side walls of the chip 1 and structurings 11 on the back of the chip. These can in turn individually or in combination serve to bring the later hermetically sealing layer into deep (hermetic) contact with the chip body. A sufficient hermetic covering is, however, already achieved without these additional structurings 10 and 11.

Figure 5:
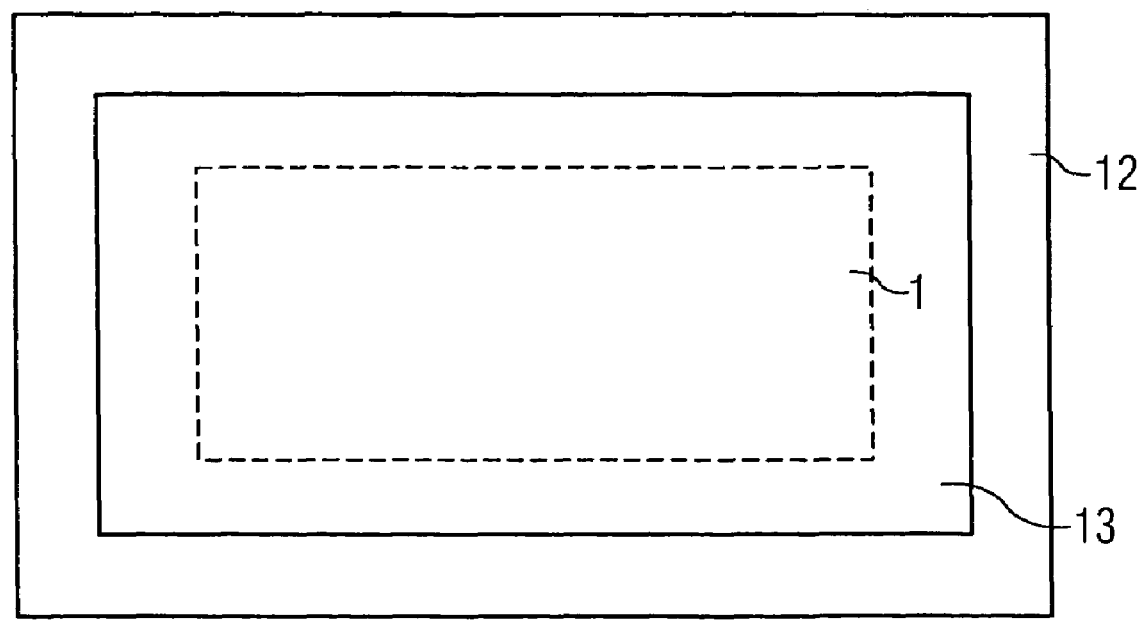
FIG. 5 is a top view of the component after a varied structuring.

FIG. 5 shows, in schematic top view, the surface of the carrier and the chip 1 in a further possibility to structure the film 8. At the edge region 13 surrounding the chip 1, the film 8 is removed in a wide (e.g., 200 µm) strip.

Figure 6:
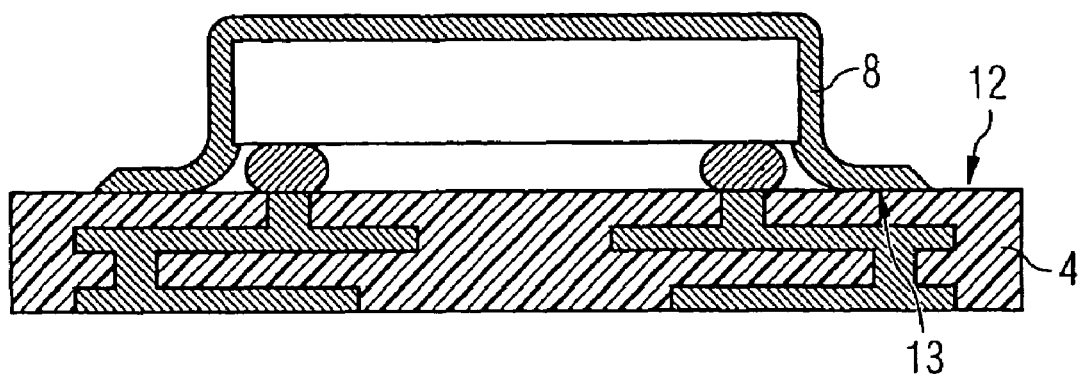
FIG. 6 is a schematic cross-section of the component after this structuring.
Figure 7:
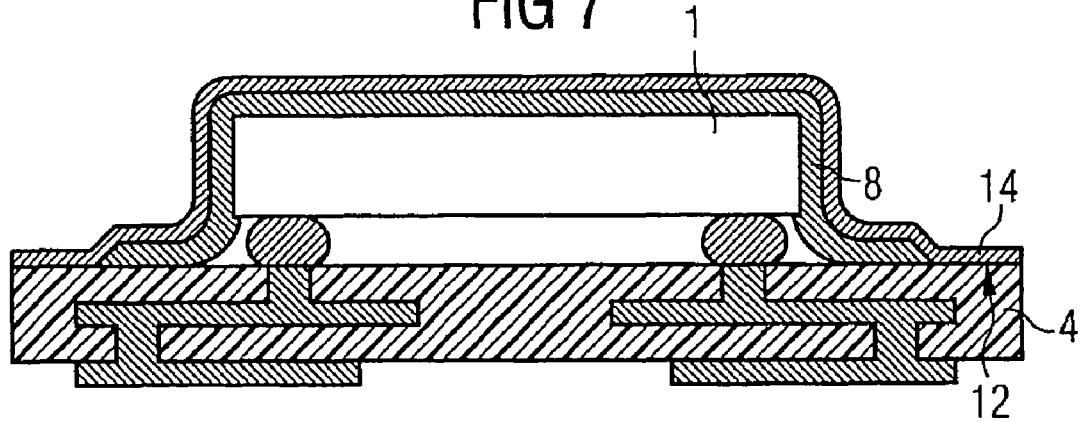
FIG. 7 is a schematic cross-section of the component after the application of the hermetically sealing layer.

FIG. 6 shows the component in schematic cross-section after this structuring variant. The contact strip 12 is now free of film, in contrast to which the film is tightly attached to the carrier 4 in the edge region 13.

As a hermetically sealing layer, a metal layer 14 is now applied to the film 8 structured according to one of the cited methods. For this, initially a metal base layer is preferably generated via sputtering of titanium and copper. This layer has, for example, a thickness of less than one µm.

To prevent non-metallized film regions, the base metallization is subsequently strengthened via current-less deposition of, for example, copper at approximately 1 to 12 µm. The metallization deposited without current can subsequently be galvanically further strengthened with copper, e.g. An approximately 2 µm-thick nickel layer (particularly for RF shielding) is subsequently applied.

The metallization is advantageously adapted to the thermal expansion of the carrier. As a result, a hermetically sealed metal layer 14 is achieved that is applied well on all sides on the structured film 8, and that is contacted with the surface of the carrier 4 in the freely structured edge 12 (contact region) or, alternatively, in the strip-shaped structuring 9. This contact forms a hermetic termination to the carrier 4 around the chip.

Figure 8:
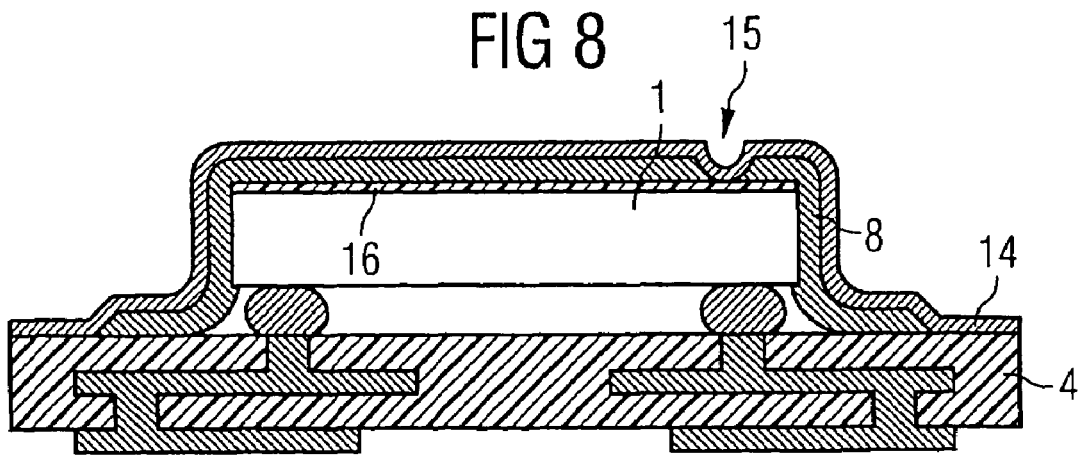
FIG. 8 is a schematic cross-section of the component showing the contacting of a back metallization on the chip with the hermetically sealing layer.

FIG. 8 shows, in schematic cross-section, a further embodiment of the invention in which the chip 1 comprises a back metallization 16, at least in partial areas of its back. Upon the structuring of the film 8, the back metallization 16 is at least partially uncovered. In the shown exemplary embodiment, the back metallization 16 is uncovered point-shaped or, respectively, strip-shaped at the location 15. Upon application of the hermetically sealed layer or of the metal layer 14, this can electrically contact with the back metallization 16 uncovered there at the location 15.

Figure 9:
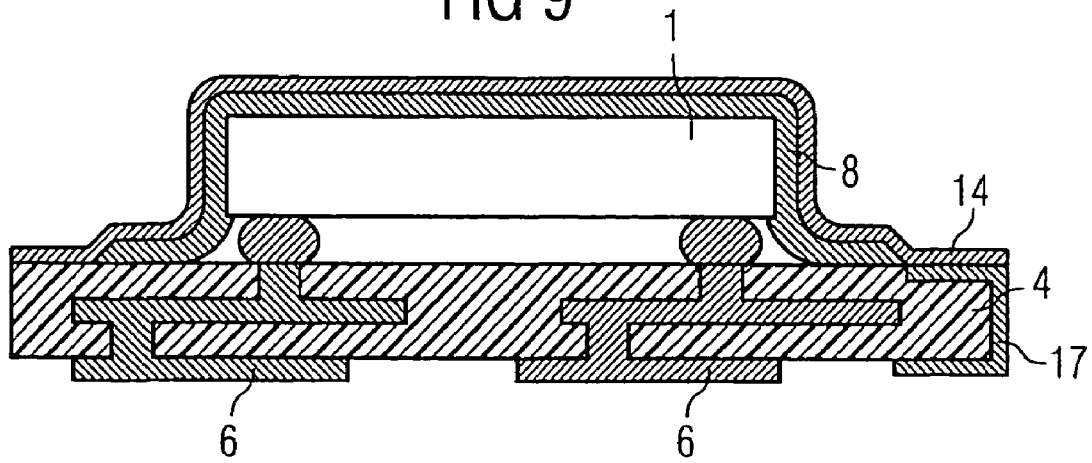
FIG. 9 is a schematic cross-section of the component showing the electrical contacting of the hermetic layer with a ground connection on the bottom of the carrier.

FIG. 9 shows an embodiment in which the metal layer forming the hermetic layer 14 overlaps with a metallization 17, and thus produces an electrical contact. The metallization is electrically conductively connected with a ground connection fashioned on the bottom of the carrier 4. It is thereby possible to connect the hermetic layer 14 to ground at freely-definable edge locations, whereby a better HF shielding of component is achieved.

Figure 10:
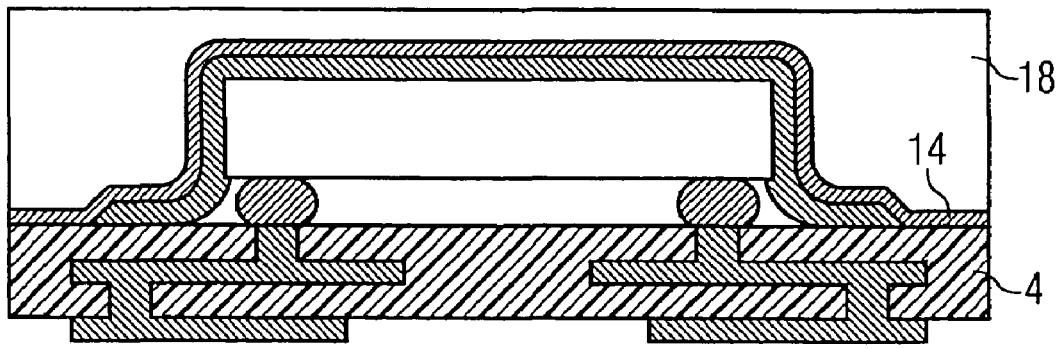
FIG. 10 is a schematic cross-section of the component after the application of a glop top synthetic covering.

FIG. 10 shows, in schematic cross-section, a further embodiment of the invention of a glob top covering over the hermetically sealed layer. This synthetic covering 18 is applied in this embodiment at such a height that it fashions an even surface parallel to the surface of the carrier. This covering, implemented for example from reaction resin, leads to a further improved hermetic termination of the component against the environment.

Figure 11:
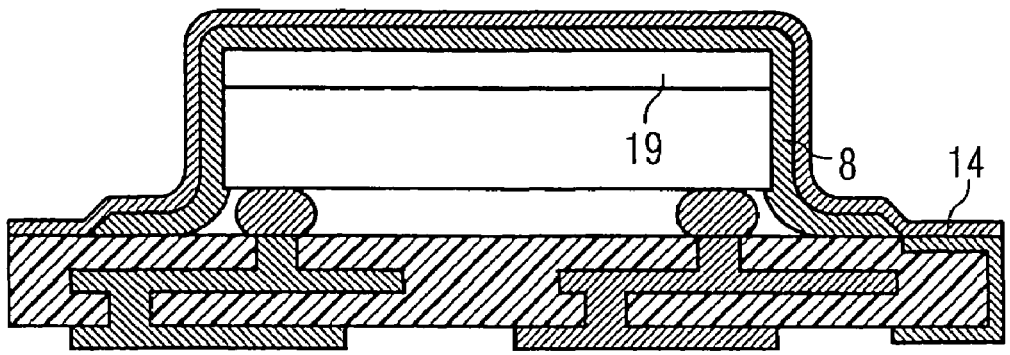
FIG. 11 is a schematic cross-section of a component with a bulk wave-dampening layer on the back of the chip.

FIG. 11 shows a further embodiment of the invention in which the film 8 and the hermetic covering 14 are combined with a bulk wave-dampening layer 19. In the shown embodiment, the bulk wave-dampening layer 19 is applied to the back of the chip before the application of the chip. It is possible to remove the film in the region of the back over the bulk wave-dampening layer 19 (not shown). It is also possible to apply the bulk wave-dampening layer 19 in the region of the back over the film 8 but beneath the hermetically sealing layer 14, for example, before the structuring of the synthetic layer.

The invention has been explained according to several exemplary embodiments, however it is not limited to these. Further variation possibilities with regard to the selection of the materials, the structuring or the combination of features shown in individual figures are contemplated by the invention. Reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The particular implementations shown and described herein are illustrative examples of the invention and are not intended to otherwise limit the scope of the invention in any way. For the sake of brevity, conventional aspects may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

The invention claimed is:

1. A method to produce a hermetic encapsulation for an electronic component, comprising:
   a) attaching and electrically contacting the electronic component based on a chip to a carrier comprising electrical connection surfaces by flip-chip technique, such that a front of the chip bearing component structures and solder connections for those component structures facing the carrier have a spacing between said front of the chip bearing said component structures and the carrier, said chip also having sides substantially perpendicular to the front and a back opposite the front and facing away from the carrier;
   b) covering of the back and sides of the chip with a film made of synthetic material, such that edges of the film overlap the chip;
   c) tightly bonding the film with the carrier in an entire edge region around the chip;
   d) structuring the film such that the film is removed around the edge region in a continuous strip parallel to the edge region and is also removed at a strip located at said sides of the chip to uncover a surface of the chip; and
   e) applying a hermetically sealing layer over the film, such that the sealing layer hermetically terminates with the carrier in a contact region outside of the edge region and also makes at least one of a sealing or shielding strip contact directly with the chip surface at the sides.

2. The method according to claim 1, further comprising, in the method steps b) and c):
   applying the synthetic material film overlapping the chip and laminating the film on the back of the chip and the carrier under pressure and increased temperature.

3. The method according to claim 1, further comprising:
   removing the film via laser ablation in method step d) in at least two strips running at a slight distance from one another parallel to the edge region, whereby a surface of the carrier or a metallization located on the surface of the carrier is uncovered.

4. The method according to claim 3, wherein the strips are fashioned with a width and a separation that approximately corresponds to a thickness of the film.

5. The method according to claim 1, wherein an inorganic layer is applied as the hermetically sealing layer, selected from the group consisting of $SiO_2$, SiC and glass.

6. The method according to claim 1, wherein a photostructuring is used to structure the film.

7. The method according to claim 1, wherein the carrier is a module on which at least one of further chips and other components are applied, contacted with the carrier, and encapsulated according to the method steps b) through e).

8. The method according to claim 1, wherein a plurality of chips are attached to, contacted to and encapsulated on a common carrier by way of the method steps a) through e), the chips being subsequently isolated via dividing the common carrier between the chips outside of the cited edge regions.

9. The method according to claim 1, further comprising:
   providing the carrier, that is a multi-layer board, with solderable metallizations, defined as bumps, on a side facing the chip, and connection metallizations electrically conductively connected with the bumps on a side facing away from the chip, a base material of the carrier being selected from the group consisting of aluminum oxide, glass, HTCC, LTCC and an organic polymer.

10. The method according to claim 1, wherein for bumps, a material of higher durability is selected that shows no mechanical deformation upon application of the film or the sealing layer.

11. A method for encapsulating a surface wave component, comprising:
    a) attaching and electrically contacting the surface wave component based on a chip to a carrier comprising electrical connection surfaces by flip-chip technique, such that a front of the chip bearing component structures and solder connections for those component structures facing the carrier have a spacing between said front of the chip bearing said component structures and the carrier, said chip also having sides substantially perpendicular to the front and a back opposite the front and facing away from the carrier;
    b) covering of the back and sides of the chip with a film made of synthetic material, such that edges of the film overlap the chip;
    c) tightly bonding the film with the carrier in an entire edge region around the chip;
    d) structuring the film such that the film is removed around the edge region in a continuous strip parallel to the edge region and is also removed at a strip located at said sides of the chip to uncover a surface of the chip; and
    e) applying a hermetically sealing layer over the film, such that the sealing layer hermetically terminates with the carrier in a contact region outside of the edge region and also makes at least one of a sealing or shielding strip contact directly with the chip surface at the sides.

12. A method for encapsulating a sensor component, comprising:
    a) attaching and electrically contacting the sensor component based on a chip to a carrier comprising electrical connection surfaces by flip-chip technique, such that a front of the chip bearing component structures and solder connections for those component structures facing the carrier have a spacing between said front of the chip bearing said component structures and the carrier, said chip also having sides substantially perpendicular to the front and a back opposite the front and facing away from the carrier;
    b) covering of the back and sides of the chip with a film made of synthetic material, such that edges of the film overlap the chip;
    c) tightly bonding the film with the carrier in an entire edge region around the chip;
    d) structuring the film such that the film is removed around the edge region in a continuous strip parallel to the edge region and is also removed at a strip located at said sides of the chip to uncover a surface of the chip; and
    e) applying a hermetically sealing layer over the film, such that the sealing layer hermetically terminates with the carrier in a contact region outside of the edge region and also makes at least one of a sealing or shielding strip contact directly with the chip surface sides.

13. A method for encapsulating an optical and at least partially light-permeable component, comprising:
    a) attaching and electrically contacting the optical component based on a chip to a carrier made from class comprising electrical connection surfaces by flip-chip technique, such that a front of the chip bearing component structures and solder connections for those component structures facing the carrier have a spacing between said front of the chip bearing said component structures and the carrier, said chip also having sides substantially perpendicular to the front and a back opposite the front and facing away from the carrier;
    b) covering of the back and sides of the chip with a film made of synthetic material, such that edges of the film overlap the chip;

c) tightly bonding the film with the carrier in an entire edge region around the chip;

d) structuring the film such that the film is removed around the edge region in a continuous strip parallel to the edge region and is also removed at a strip located at the chip to uncover a surface of the chip; and e) applying a hermetically sealing layer over the film, such that the sealing layer hermetically terminates with the carrier in a contact region outside of the edge region and also makes at least one of a sealing or shielding strip contact directly with the chip surface at the sides.

14. The method according to claim 13, further comprising, in the method step e):

applying initially a base metallization without current to the film and thickening the base metallization on top of its total free surface to the required thickness via at least one sputtering, vaporization, currentless deposition, galvanic deposition, contacting a molten metal, or via a combination of these, wherein the thickening of the metallization is done substantially by contacting a molten metal.

* * * * *